Sept. 25, 1973 J. M. SHANNON 3,761,319

METHODS OF MANUFACTURING SEMICONDUCTOR DEVICES

Filed May 17, 1971

4 Sheets-Sheet 1

METHODS OF MANUFACTURING SEMICONDUCTOR DEVICES

Filed May 17, 1971

3,761,319

METHODS OF MANUFACTURING SEMICONDUCTOR DEVICES

John Martin Shannon, Reigate, England, assignor to U.S. Philips Corporation
Filed May 17, 1971, Ser. No. 144,009
Claims priority, application Great Britain, May 22, 1970, 25,029/70
Int. Cl. H01l 7/54
U.S. Cl. 148—1.5 30 Claims

ABSTRACT OF THE DISCLOSURE

A method of manufacturing a semiconductor device wherein a semiconductor body comprising a boundary between a higher doped region and a lower doped region is subjected to bombardment with accelerated particles or ions which are directed towards the boundary from the lower doped side. The bombardment which is preferably effected with protons causes internal damage of the crystal structure in the vicinity of the boundary. The semiconductor body is heated during the bombardment and enhanced diffusion of impurity is produced across the boundary from the higher doped region into the lower doped region.

Figure 1:
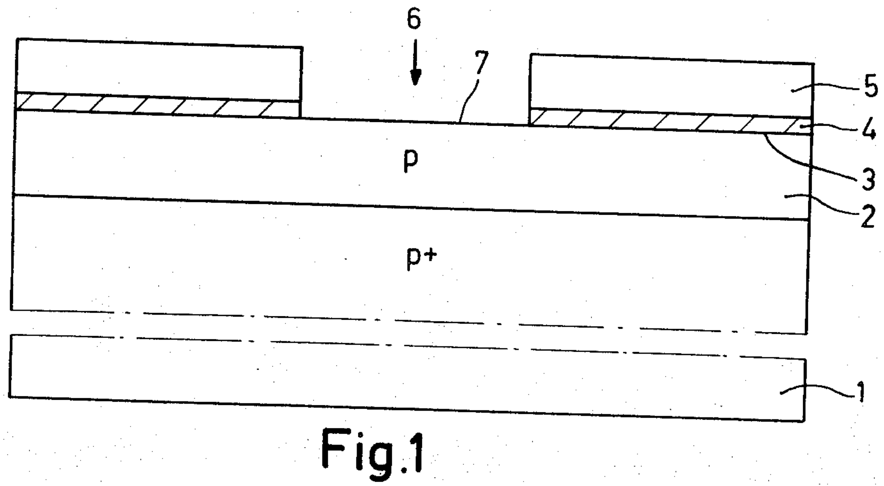

In one form the method is applied in the manufacture of a semiconductor integrated circuit comprising a semiconductor substrate and epitaxial layer thereon, said substrate and epitaxial layer being of different conductivity types. Proton bombardment is effected to produce enhanced impurity diffusion in determining isolation walls in the epitaxial layer and for determining the extent end location of a portion of a highly doped part of a transistor collector region lying in the epitaxial layer directly below the transistor emitter region, also for partly determining a collector contact region. In another form the method is applied in the manufacture of a semiconductor integrated circuit comprising a semiconductor substrate and epitaxial layer thereon, said substrate and epitaxial layer being of the same conductivity type. Proton bombardment is effected to produce enhanced impurity diffusion in determining a collector wall region in the epitaxial layer and in determining the extent and location of a portion of a highly doped part of a transistor collector region lying directly below the transistor emitter region.

This invention relates to methods of manufacturing semiconductor devices.

In the semiconductor art the formation in a semiconductor body of regions of different conductivity and/or conductivity type by the techniques of diffusion, epitaxy, and ion implantation either singly or in combination is well established. In many applications of these techniques the processing is effected with reference to a plane surface, for example an epitaxial layer is deposited on a plane surface of a substrate region, impurity diffusion is effected into a portion of a plant surface exposed by an opening in an insulating layer on the surface, and ion implantation is effected into a portion of a plane surface defined by an opening in a masking layer at the surface. This results in many cases in the formation of a boundary between two regions of different conductivity and/or conductivity type which extends for a large part substantially parallel to the plane surface. When it is desired to form the regions with a boundary which has different portions spaced by different distances from the plane surface the manufacturing steps may become extremely complex.

Another problem frequently encountered is when, having formed a higher doped region and a lower doped region in a semiconductor body with a boundary therebetween and the higher doped region extending further remote from the surface than the lower doped region, it is subsequently desired to redistribute the impurity concentration in these regions by impurity diffusion across the boundary from the higher doped region into the lower doped region in a direction towards said surface. For this purpose a heating step may be carried out to cause impurity diffusion from the higher doped region into the lower doped region but in many instances this is not satisfactory as an undesired redistribution of impurity may occur in another part of the semiconductor body where a boundary exists between a higher doped region and a lower doped region. Furthermore by the use of such a heating step it is not readily possible to cause the selective diffusion across only part of the boundary between the higher doped region and the lower doped region. Such a selective diffusion may be desirable for certain applications, for example in the manufacture of a planar bipolar transistor having a low base/collector junction capacitance where it is required to adjust the impurity concentration in a highly doped part of the collector region in a portion only thereof, said portion being situated directly below the emitter region. Another application where such a selective diffusion is desirable is in the manufacture of a semiconductor integrated circuit in which impurity diffusion is effected to define a wall surrounding an island in an epitaxial layer, said wall and epitaxial layer being of different conductivity types. For example in a semiconductor integrated circuit having conventional p-n junction isolation in which an epitaxial layer of one conductivity type is deposited on a higher doped substrate of the opposite conductivity type and islands of the one conductivity type are formed in the epitaxial layer by diffusing an impurity characteristic of the opposite conductivity type into portions of the epitaxial layer to form isolating walls of the opposite conductivity type. When forming the isolating walls between the substrate and the epitaxial layer it would be desirable to obtain a selective diffusion of impurity characteristic of the opposite conductivity type from the substrate into the layer across parts of the epitaxial layer/substrate interface in registration with the areas at which the impurity is diffused into the epitaxial layer. In this manner long diffusions at high temperatures could possibly be avoided because diffusion in the epitaxial layer to form the isolating walls would occur from opposite sides of the layer in opposite directions. Similarly in a semiconductor integrated circuit having a so-called "collector-tub" isolation in which buried regions of one conductivity type are situated between a substrate region and an epitaxial layer of the opposite conductivity type and walls of the one conductivity type are formed extending between the surface of the epitaxial layer and the buried regions by diffusion of an impurity characteristic of the one conductivity type into portions of the surface of the epitaxial layer it would be desirable to obtain a selective diffusion into the epitaxial layer from the part of the buried region in registration with said portions of the epitaxial layer surface. Thus the walls would be formed in the epitaxial layer by diffusion from opposite sides thereof in opposite directions and again the necessity of a long diffusion at high temperature would not arise.

According to the invention, in a method of manufacturing a semiconductor device, a semiconductor body comprising a boundary between a higher doped region and a lower doper region is subjected to bombardment with accelerated particles or ions which are directed towards the boundary from the side thereof at which the lower doped region is present, the bombardment being effected to cause internal damage of the crystal structure in the vicinity of the boundary, and the semiconductor body being maintained at an elevated temperature during said bombardment to produce an enhanced diffusion of impurity across the boundary from the higher doped region into the lower doped region.

This method has various advantages in specific applications to be described hereinafter but basically has the advantage that the enhanced impurity diffusion induced by the bombardment may be readily effected at a temperature at which the impurity distribution in other parts of the semiconductor body is not substantially disturbed and may be localised at a part only of the boundary by appropriate control of the incidence on the semiconductor body of the bombarding particles or ions.

The damage of the internal crystals structure is caused by the bombarding particles or ions creating vacancy interstitial pairs in the vicinity of the boundary. These vacancies will migrate. By maintaining the semiconductor body at an elevated temperature during bombardment, enhanced impurity diffusion occurs from the higher doped region into the vacancies in the lower doper region.

The choice of accelerated particles or ions depends, inter alia, on the specific manufacture. However, protons are particularly suitable because protons having energies readily obtainable with conventional apparatus have a mean range in semiconductor materials, for example silicon, which is of sufficient magnitude to cause the internal damage of the crystal structure at a predetermined location in the body where such damage is desired. Other particles which may be used, for example, are neutrons, electrons or gamma rays, although in many instances proton bombardment will be preferred because of the greater damage produced for a given dose.

Alternatively the bombardment may be effected with various ions, for example with impurity ions which are implanted in the semiconductor body and in addition to causing internal damage of the crystal structure also serve to determine the conductivity and/or conductivity type of a region of the semiconductor body.

The elevated temperature at which the semiconductor body is maintained during bombardment will be determined in accordance with the nature of the bombarding particles or ions, for example with some particle bombardment the temperature rise of the semiconductor body produced by the bombarding particles will not necessitate an external source of heat. However when using proton bombardment the semiconductor body is preferably heated at a temperature in the range of 500° C. to 700° C. using an external heating source.

The incidence of the bombarding particles or ions on the semiconductor body may be such as to produce channelling of the crystal lattice by said particles or ions. However this is not an essential condition of bombardment and the use of channelling may be dependent on the distance in the semiconductor body necessary for the particles or ions to penerate to reach the vicinity of the boundary between the higher doped region and the lower doped region. Thus for example in silicon, protons of 150 kev. energy have a mean range of approximately 1.3 microns and hence when the boundary is situated at a distance of 4 microns from the surface which is subjected to the bombardment, due to the diffusion of the vacancies created by the protons a substantial number of vacancies will occur in the vicinity of the boundary. Enhanced impurity diffusion from the higher doped region will occur into the vacancies. As the protons have a substantially Gaussian distribution in the silicon body then damage will occur over a substantial distance. When the incidence of the protons is such as to cause channelling the mean range in silicon of protons of 150 kev. energy is approximately 10 microns. If the silicon body comprises a lower doped surface region, for example of 4 microns thickness, on a higher doped region, then the channeling protons will penetrate the lower doped region and a large proportion will lose their energy near the boundary where a collision cascade will occur and substantial damage produced. It is not essential to obtain perfect channeling of the crystal lattice, the main criterion being that when using channelling a large proportion of the channelling protons shall lose their energy in the vicinity of the boundary.

In a method in accordance with the invention the higher doped region and the lower doped region may be of the same conductivity type or may be of different conductivity types.

The boundary may substantially coincide with the interface between a substrate region of the body and an epitaxial layer thereon. The higher doped region may lie mainly in the substrate region and the lower doped region lie in the epitaxial layer.

In a preferred form of the method the incidence of the bombarding particles or ions on the semiconductor body at the side of the boundary at which the lower doped region is present is localised so that the bombardment induced enhanced impurity diffusion from the higher doped region into the lower doped region is produced across only a part of the area of the boundary. This form of the method is particularly useful in the manufacture of a planar bipolar transistor where it is desired to profile a highly doped part of the collector region and in the manufacture of a semiconductor integrated circuit where it is desired to produce an isolation boundary wall extending through an epitaxial layer without performing a long high temperature diffusion step. These applications of the method will be described in further detail hereinafter.

In the said preferred form of the method in which the incidence of the bombarding particles or ions on the semiconductor body is localised, the bombardment may be effected in the presence of a mask at the semiconductor body surface, the bombardment induced enhanced impurity diffusion being produced across a part of the area of the boundary determined by an opening in the mask.

The bombardment may be effected to produce, simultaneously with the enhanced impurity diffusion from the higher doped region into the lower doped region, enhanced diffusion of impurity in the opposite direction from a further higher doped region into a lower doped region. This simultaneous enhanced impurity diffusion in opposite directions may be effected for various applications, for example the enhanced impurity diffusion from the further higher doped region to a lower doped region may consist in the advance into the body of a p-n junction between the further higher doped region and a lower doped region, the further higher doped region having been previously provided as a surface region, for example by diffusion, and this surface region being subjected to the particle or ion bombardment. However in a preferred form the two initially higher doped regions are of the same, one conductivity type and spaced by a common lower doped region, the simultaneously produced bombardment induced enhanced impurity diffusions in opposite directions being effected to yield a continuous region of said one conductivity type between said initially higher doped regions. This preferred form may be used advantageously in the manufacture of a semiconductor integrated circuit when forming a boundary wall extending through an epitaxial layer or for forming a transistor collector contact region extending through an epitaxial layer to a buried region of the one conductivity type, these methods being described in further detail hereinafter.

A method in accordance with the invention may be employed in the manufacture of a planar bipolar transistor, wherein the bombardment induced enhanced impurity diffusion is effected to determine the extent and doping of a part of the collector region, for example a part of the collector region situated directly below the emitter region. Thus in one such method a transistor is formed which comprises a collector region having a highly doped part which is situated underlying the collector/base junction, said highly doped part comprising a first portion extending below a first area of the collector/base junction which lies directly below the emitter region and an adjoining, second portion situated below an adjoining, second area of the collector/base junction, said first portion being situated closer to the common surface at which the transistor junctions terminate than the adjoining, second portion, the extent of said first portion being determined by the said bombardment induced enhanced impurity diffusion produced by bombardment of an area of the common surface corresponding substantially in size and position to the area of said surface occupied by the emitter region. A transistor of such a configuration may be formed having a very low collector/base junction capacitance. The use of the bombardment induced enhanced impurity diffusion to form such a configuration of the highly doped part of the collector region provides a very simple method of this so-called profiling of the collector. Hitherto complex epitaxial deposition and/or diffusion steps were used to produce such a profiling of the collector. Furthermore in said previously used methods, after providing the said profiling of the highly doped part of the collector region it is necessary to locate the said first portion precisely for performing the subsequently carried out emitter diffusion step, this location being required to ensure that the emitter lies directly above said first portion. In the method in accordance with the invention this location step can be avoided by effecting the bombardment at an area of the common surface exposed by an opening in a masking layer on the common surface, said opening being subsequently used for introduction of the emitter impurity concentration into the body. In this manner the location of the emitter over the said first portion of the highly doped part of the collector region may be extremely precise.

The said profiling of the highly doped part of the collector region by the bombardment induced enhanced impurity diffusion may be performed for various transistor structures. In one form the higher doped region and the lower doped region between which bombardment induced enhanced impurity diffusion is effected are both of the same, one conductivity type as the collector region to be formed, the higher doped region being present at the surface portion of a substrate region of the one conductivity type and the lower doped region being present in an epitaxial layer of the one conductivity type on the substrate region, said second portion of the highly doped part of the collector region being formed by the bombardment induced enhanced impurity diffusion in the epitaxial layer. Thus by this form of the method an epitaxial planar transistor structure may be formed having the said profiling of the highly doped part of the collector region. Alternatively a transistor in a semiconductor integrated circuit may be formed having the said collector profiling and will be described hereinafter.

A method in accordance with the invention may be employed in the manufacture of a semiconductor integrated circuit, wherein the bombardment induced enhanced impurity diffusion is effected to at least partially define a wall surrounding an island in an epitaxial layer, said wall and epitaxial layer being of different conductivity types. This form of the method may be used in conventional p-n junction isolation integrated circuits where the epitaxial layer and underlying substrate region are of different conductivity types and also in so-called "collector-tub" isolation integrated circuits where the epitaxial layer and underlying substrate region are of the same conductivity type.

Thus in one preferred form the semiconductor body comprises an epitaxial layer of one conductivity type on a substrate region of the opposite conductivity type, the substrate region having a higher doping than the epitaxial layer at the boundary therebetween, enhanced diffusion of impurity characteristic of the opposite conductivity type across a portion of said boundary from the substrate region to the epitaxial layer being effected by the bombardment of a portion of the epitaxial layer surface, said bombardment induced enhanced impurity diffusion at least partly defining a wall of the opposite conductivity type extending from the substrate region to the surface of the epitaxial layer, said wall surrounding an island of the one conductivity type in the epitaxial layer. In this method prior to the bombardment, at the said portion of the epitaxial layer surface a region of the opposite conductivity type may be formed extending in, but not through, the epitaxial layer, the enhanced impurity diffusion effected on bombardment forming a continuous wall of the opposite conductivity type between said region of the opposite conductivity type and the substrate region.

Simultaneously with the definition of the boundary wall by the enhanced impurity diffusion, the extent and doping of a part of the collector region of a transistor to be formed in an island in the epitaxial layer may also be determined by bombardment induced enhanced impurity diffusion characteristic of the one conductivity type into the island from a highly doped buried region of the one conductivity type situated at the interface between the substrate region and epitaxial layer. This bombardment induced enhanced impurity diffusion characteristic of the one conductivity type may be effected to determine the extent and doping of a highly doped part of the collector region located directly below the emitter region.

A part of the collector region extending between the buried region and the surface of the epitaxial layer and forming a low resistance path from the surface to the buried region may also be determined by bombardment induced enhanced impurity diffusion.

In another preferred form of the method for the manufacture of a semiconductor integrated circuit the semiconductor body comprises a buried region of one conductivity type situated between a substrate region of the opposite conductivity type and an epitaxial layer of the opposite conductivity type, said epitaxial layer having a lower doping than the buried region at the boundary therebetween, enhanced impurity diffusion being effected across a portion of said boundary from the buried region into the epitaxial layer by the bombardment of a portion of the epitaxial layer surface, said bombardment induced enhanced impurity diffusion at least partly defining a wall of the one conductivity type extending from the buried region to the surface of the epitaxial layer, said wall surrounding an island of the opposite conductivity type in the epitaxial layer. The wall and buried region may together constitute the collector region of a transistor, the emitter and base being formed in the island of the opposite conductivity type surrounded by said wall and buried region.

In the above described method prior to the bombardment, at said portion of the epitaxial layer surface a region of the one conductivity type may be formed extending in, but not through, the epitaxial layer, the bombardment induced enhanced impurity diffusion forming a continuous wall of the one conductivity type between said region of the one conductivity type and the buried region of the one conductivity type.

Simultaneous with the definition of the wall by the enhanced impurity diffusion, the extent and doping of a part of the collector region of a transistor may also be determined by bombardment induced enhnaced impurity diffusion characteristic of the one conductivity type into the island from the buried rgion, the buried region and wall of the one conductivity type forming part of the collector region and the emitter region and base region being formed in the island surrounded thereby, said part of the collector region lying directly below the emitter region.

In a method in accordance with the invention for the manufacture of a semiconductor integrated circuit the bombardment induced enhanced impurity diffusion may be effected at a plurality of locations in the semiconductor body to at least partly define a plurality of walls in the epitaxial layer. Furthermore the bombardment induced enhanced impurity diffusion may be effected at a plurality of locations in the semiconductor body to define a plurality of transistor collector region parts, the transistors being formed in or associated with one or more islands in the epitaxial layer. The definition of the walls and the collector region parts by bombardment induced enhanced impurity diffusion may be effected simultaneously, and in this manner definition of isolation walls and collector region parts can be obtained over a large area semiconductor slice in a single operation in a relatively short period.

Figure 2:
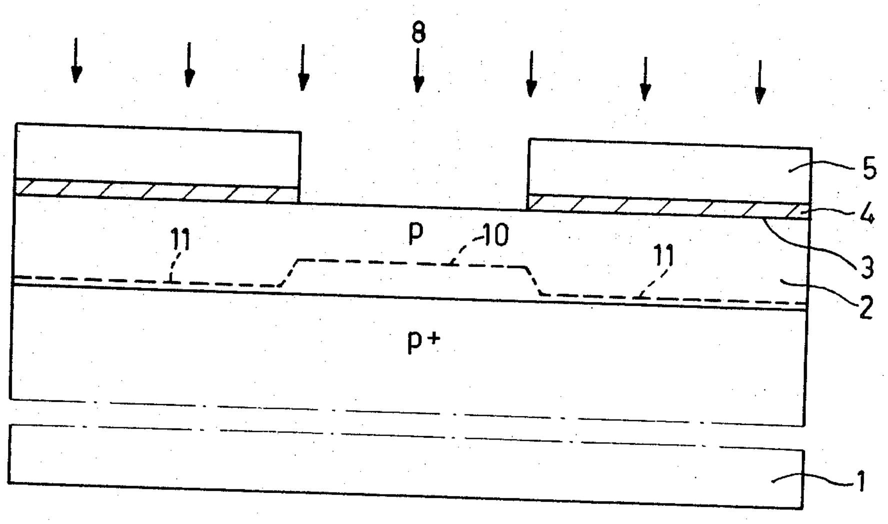

Embodiments of the invention will now be described, by way of example, with reference to the accompanying diagrammatic drawings, in which:

FIGS. 1 and 2 are cross-sections of a semiconductor body during successive stages of a first embodiment of a method in accordance with the invention, this being a general embodiment and serving to illustrate bombardment induced enhanced impurity diffusion across a boundary from a higher doped region into a lower doped region;

FIGS. 3 to 8 inclusive are sections of a semiconductor body at successive stages of a second embodiment of a method in accordance with the invention, this embodiment being the manufacture of a semiconductor integrated circuit having conventional p-n junction isolation in which bombardment enhanced impurity diffusion is used to determine an isolation wall, a highly doped part of the collector region of a transistor of the integrated circuit, and a collector contact region of the transistor;

FIGS. 9 to 12 inclusive are sections of a semiconductor body in a third embodiment of a method in accordance with the invention, this embodiment being the manufacture of a semiconductor integrated circuit having so-called "collector-tub" isolation in which bombardment induced enhanced impurity diffusion is used to determine a wall and a highly doped part of a collector region of a transistor of the integrated circuit.

Referring now to FIGS. 1 and 2, on a boron doped $p^+$-silicon substrate 1 of 0.001 ohm-cm. resistivity and approximately 200 microns thickness there is epitaxially deposited a lower doped p-type epitaxial layer 2 of 5 ohm-cm. resistivity containing boron as the acceptor dopant and having a thickness of 3 microns. The boron doping in the epitaxial layer is substantially uniform and has a value of approximately $10^{15}$ atoms/cm.$^3$. The orientation of the surface of the substrate is <111>. On the surface 3 of the epitaxial layer there is grown a layer of silicon oxide 4 of 1200 A. thickness by oxidation in wet oxygen at an elevated temperature. After oxidation a molybdenum layer 5 of approximately 1 micron thickness is deposited on the silicon oxide layer. By a photoprocessing and etching step an opening 6 is made in the molybdenum layer 5 and underlying silicon oxide layer 4 to expose a surface portion 7 of the epitaxial layer, the molybdenum and silicon oxide layers being defined using a single masking step. The molybdenum is etched with a mixture of concentrated nitric acid, concentrated sulphuric acid and water, the parts ratio of the constituents being 1:7:1 in said order.

The semiconductor body is then placed in the target chamber of a proton accelerator apparatus with the exposed surface portion 7 normal to the beam axis. Proton bombardment is effected while heating the semiconductor body at 700° C., the proton energy being 150 kev. and the dose being $2.0\times10^{16}$ sq. cm. The effect of the proton bombardment is to cause damage to the internal crystal structure at a location below the surface portion 7 only, the molybdenum layer 5 acting as a mask. The protons generate vacancy interstitial pairs. The mean range of the protons is 1.3 microns and the area at which damage to the crystal structure occurs spreads well beyond this distance, significant damage occurring in the vicinity of the boundary between the higher doped substrate and the lower doped epitaxial layer thereon. Protons which channel the crystal lattice have a much higher range and will pass through the epitaxial layer to the substrate 1. On reaching the substrate 1 these channelling protons will give rise to a collision cascade and cause much damage at the boundary. At the heating temperature of 700° C. boron atoms in the higher doped substrate 1 will diffuse across the boundary into the vacancies created in the lower doped epitaxial layer 2 by the damage. FIG. 2 illustrates this step, the proton beam being shown diagrammatically by reference numeral 8. The broken line is the contour of the boron concentration of $10^{15}$ atoms/cm.$^3$, this being the original concentration in the epitaxial layer 2. The enhanced boron diffusion from the higher doped substrate 1 into the lower doped epitaxial layer 2 yields a contour which has a portion 10 lying directly below the surface portion 7 extending closer to the surface 3 than an adjoining portion 11 below the molybdenum masking layer. Between the portion 10 and the epitaxial layer/substrate interface the boron concentration ranges from $10^{15}$ atoms/cm.$^3$ to $10^{20}$ atoms/cm.$^3$. The distance of the portion 10 from the surface is approximately 2 microns. The portion 11 is shown extending in the expitaxial layer spaced by a small distance from the epitaxial layer/substrate interface because during epitaxy and the subsequent heating during proton bombardment a small diffusion of boron occurs from the substrate into the epitaxial layer at these portions.

This embodiment demonstrates the enhanced impurity diffusion across only part of a boundary between a higher doped region and a lower doped region, the bombardment being effected only at a portion 7 of the semiconductor surface defined by an opening 6 in a masking layer 5. The method may be used in a similar manner for a substrate and epitaxial layer which are both of n-type silicon or alternatively for a substrate and epitaxial layer which are of different conductivity types.

Referring to FIGS. 3 to 8, the application of a method in accordance with the invention for the manufacture of a semiconductor integrated circuit having conventional p-n junction isolation will now be described.

The starting body is a boron doped $p^+$-silicon substrate of 0.01 ohm-cm. resistivity and 200 microns thickness. On a surface of <111> orientation a silicon oxide layer of 2000 A. thickness is grown by oxidation in wet oxygen at an elevated temperature. By a photoprocessing and etching step a plurality of openings are formed in the silicon oxide layer. Phosphorus is then diffused into the exposed portions of the substrate to form a plurality of highly doped $n^+$-regions having a phosphorus surface concentration of approximately $10^{20}$ atoms/cm.$^3$. Thereafter the silicon oxide layer is removed and the surface of the substrate prepared for epitaxial deposition. An n-type epitaxial layer of 10 ohm-cm. resistivity uniformly doped with phosphorus, and of 3 microns thickness is epitaxially deposited on the substrate surface. This layer buries the previously diffused $n^+$-regions and during epitaxial deposition some phosphorus from these buried regions diffuses into the less highly doped overlying deposited material of the n-type epitaxial layer.

Subsequently a silicon oxide layer of 3,000 A. is grown on the epitaxial layer surface by oxidation in wet oxygen at an elevated temperature. A plurality of openings are formed in the newly grown oxide layer by a photoprocessing and etching step, these openings being located in registration with edge portions of the $n^+$-buried regions. Phosphorus is diffused into these openings to form $n^+$-colletcor contact regions, the diffusion being carried out in two stages, the first stage consisting of a phosphorus deposition step to form a surface sheet resistance of 20 ohms per square and the second stage consisting of a drive-in step for 10 minutes at 1100° C. in wet oxygen. Thereafter a further oxidation is effected to seal the opening in which the phosphorus diffusion has been effected and for this purpose a further silicon oxide layer of approximately 1200 A. is grown in wet oxygen at an elevated temperature.

Figure 3:
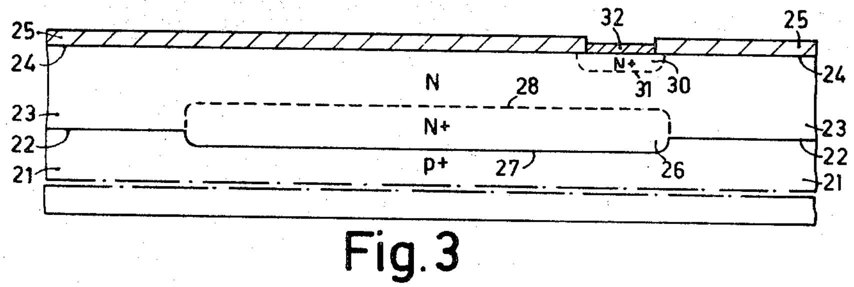

FIG. 3 shows part of the semiconductor body after this stage of the processing. On a surface 22 of a $p^+$-substrate 21 there is an n-type epitaxial layer 23. On the surface 24 of the epitaxial layer 23 there is a silicon oxide layer 25 of a thickness in excess of 3500 A. An $n^+$-region 26 is buried between the $p^+$-substrate 21 and the n-type epitaxial layer 23. The $n^+$-buried region 26 forms a p-n junction 27 in the substrate. The $n^+$-buried region 26 also extends into the lower doped n-type epitaxial layer 23 and the broken line 28 is the contour of a phosphorus concentration corresponding to the background doping of the layer, this contour extending approximately 2 microns from the surface 24. At the surface 24 there is a phosphorus diffused $n^+$-collector contact region 30 situated directly above an end portion of the buried region 26. The broken line 31 represents the contour of phosphorus concentration equal to the background concentration in the layer 23 and extends at a maximum distance of 0.75 micron from the surface 24. An insulating layer portion 32 of a phosphosilicate glass which has been thickened by further oxidation is present in the opening where the diffusion was effected to form the region 30.

The next stage in the processing is to make further openings in the silicon oxide layer 25 by a photoprocessing and etching step. Boron is then diffused into these openings. The boron diffusion consists of a deposition stage to form a surface sheet resistance of 30 ohms per square and a drive-in stage for 10 minutes at 1100° C. Thereafter openings are made in the silicon oxide layer by a further photoprocessing and etching step, said openings including the surface portions occupied by some of the boron diffused regions. A boron doped oxide layer of 0.5 micron thickness is then deposited over the whole surface from a mixture of diborane ($B_2H_6$) and silane ($SiH_4$) in oxygen. After this deposition a layer of molybdenum of 1.0 micron thickness is deposited over the entire surface of the boron doped oxide layer.

Figure 4:
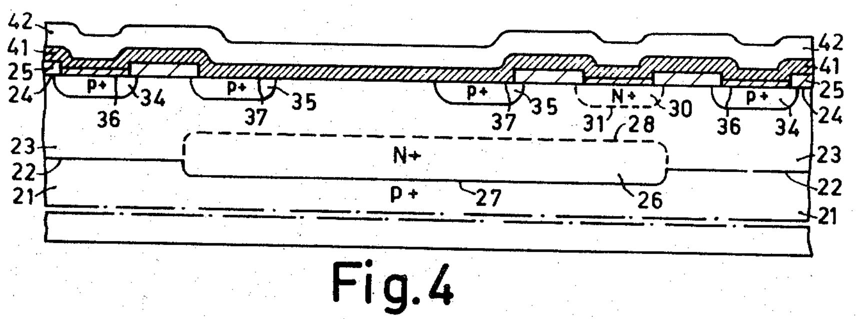

FIG. 4 shows the body at this stage of the processing. The boron diffusion step produces $p^+$-surface regions 34 which are to serve for solation wall definition and $p^+$-surface regions 35 which are to serve as base contact portions. The $p^+$-regions 34 are situated at portions 36 of the surface and the $p^+$-regions 35 are situated at portions 37 of the surface, said portions 36 and 37 having been defined as openings in the oxide layer 25. The boron doped oxide layer 41 extends in direct contact with the silicon surface at a central opening in the thermally grown oxide layer 25. The molybdenum layer 42 extends wholly above the boron doped oxide layer 41.

By a photoprocessing and etching step openings are made in the molybdenum layer and underlying boron doped oxide layer using a single masking stage. The openings expose the surface portions 36 of the silicon at which the $p^+$-region 34 extend, surface portions situated directly above the $n^+$-collector contact regions 30, and further surface portions each substantially centrally disposed above a buried region 26 and having a size and position ultimately destined for the diffusion of a transistor emitter impurity concentration. It is noted that at this stage of the processing the surface portions 37 above the $p^+$-base contact regions 35 remain covered by the boron doped oxide layer.

Figure 5:
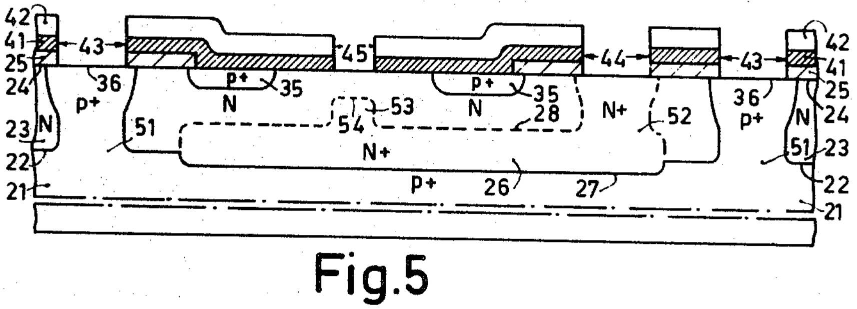
Figure 6:
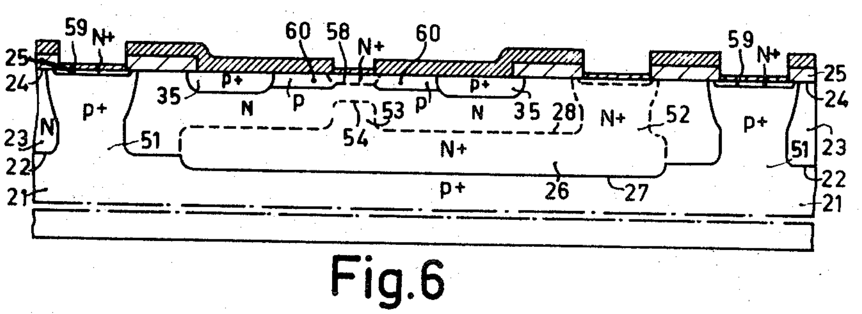

The semiconductor body is then subjected to proton bombardment at 700° C. under exactly the same conditions of orientation, energy and dose as in the previously described embodiment. FIG. 5 shows the body after the proton bombardment and heating step. On parts of the surface 24 there are parts of the silicon oxide layer 25 covered by the boron doped oxide layer 41 and on other parts of the surface 24 the boron doped oxide layer 41 is in direct contact with the silicon. On all parts of the layer 41 molybdenum layer parts 42 are present. Openings 43 in the molybdenum layer 42 and underlying oxide layer parts 41 and 25 expose the surface portions 36. An opening 44 exposes the surface portion where phosphorus diffusion was effected to from the $n^+$-collector contact region 30. A further opening 45 is substantially centrally disposed over the buried region 26. The proton bombardment at these openings and heating at 700° C. during proton bombardment yield the structure shown in FIG. 5. The bombardment in openings 43 produces damage in the vicinity of the interface between the epitaxial layer 23 and the substrate 21 and at the heating temperature of 700° C. enhanced diffusion of boron occurs from the higher doped substrate 21 into the lower doped epitaxial layer 23 at areas located directly below the openings 43. Furthermore the bombardment and heating causes the initially diffused boron concentrations in the $p^+$-regions 34 to extend further into the epitaxial layer. This results in the formation of $p^+$-isolation walls 51 extending between the epitaxial layer surface and the substrate 21. At the area of the opening 44 the proton bombardment causes damage in the underlying parts of the epitaxial layer in the vicinity of the boundary between the n-type material of the epitaxial layer and the $n^+$-buried region and at the heating temperature of 700° C. enhanced diffusion of phosphorus from the higher doped buried region 26 into the lower doped epitaxial layer 23 occurs at an area immediately below the opening 44. The proton bombardment at the area of the opening 44 also produces damage in the portion of the epitaxial layer immediately below the previously diffused $n^+$-region 30 and at the heating temperature of 700° C. enhanced diffusion of phosphorus occurs into the underlying epitaxial layer part from the $n^+$-region 30. The simultaneously effected enhanced diffusion of phosphorus in opposite directions results in the formation of a continuous $n^+$-region 52 extending between the epitaxial layer surface at the opening 44 and the $n^+$-buried region 26, said region 52 constituting a low resistance connecting path between the surface at which a collector contact is to be provided and the buried region 26. The proton bombardment of the surface portion at the opening 45 produces damage in the underlying parts of the n-type epitaxial layer in the vicinity of the boundary between the n-type material of the layer and the $n^+$-buried region 26 and at the heating temperature of 700° C. enhanced diffusion of phosphorus occurs from the higher doped $n^+$-buried region 26 into the lower doped n-type epitaxial layer at a location directly below the opening 45. This forms a highly doped $n^+$-portion 53 extending directly below the opening 45, the broken line 54 showing the newly formed contour of phosphorus concentration equal to the background concentration in the epitaxial layer.

From the above it is clear that by the proton bombardment and heating step enhanced diffusion of impurity occurs across boundaries between higher doped and lower doped regions at three different areas defined by openings 43, 44, 45, this enhanced impurity diffusion being effected simultaneously and effectively determining the $p^+$-isolation walls 51 of the integrated circuit, the $n^+$-collector contact regions 52 of transistors to be formed in islands defined in the epitaxial layer by the isolation walls 51, and the $n^+$-collector region portions 53 of said transistors which are to extend directly below the emitter regions thereof, said emitter regions being formed by a subsequent diffusion step.

Thereafter the molybdenum layer parts 42 are removed. A heating step is then effected at 950° C. to diffuse boron into the underlying silicon from the boron doped oxide layer parts which are in direct contact with the silicon surface. Where the boron doped oxide layer parts are situated on parts of the thermally grown oxide layer 25 no boron penetrates into the underlying silicon because these parts of the layer 25 act as a mask. An emitter diffusion step is then performed. The phosphorus source for this emitter diffusion is phosphine gas in nitrogen at a proportion of 100 p.p.m. This is mixed with oxygen in the diffusion furnace and heating effected in such an atmosphere at 900° for 15 minutes. This results in the diffusion of phosphorus into the openings 43, 44 and 45 remaining in the silicon oxide layer after removal of the molybdenum masking layer. At the opening 45 an $n^+$-emitter region concentration of phosphorus 57 (FIG. 6) is produced, the broken line 58 being the contour where the diffused phosphorus concentration is equal to the background concentration in the epitaxial layer. In the openings 43 $n^+$-regions 59 are formed and these are not essential to the manufacture but the main feature of this step is that the emitter region concentration 57 is formed after the proton bombardment without having to make a further masking step. Furthermore the phosphorus is also diffused into the surface portion exposed by the opening 44 and increases the surface concentration of the $n^+$-collector contact region 52. The effect of the previously carried out diffusion from the parts of the boron doped oxide layer 41 into the directly underlying silicon surface parts is to determine a p-type surface region 60 the outer perimeter of which is bounded by the $p^+$-regions 35 and the inner perimeter of which is situated below the extremity of the $n^+$-region 57.

Figure 7:
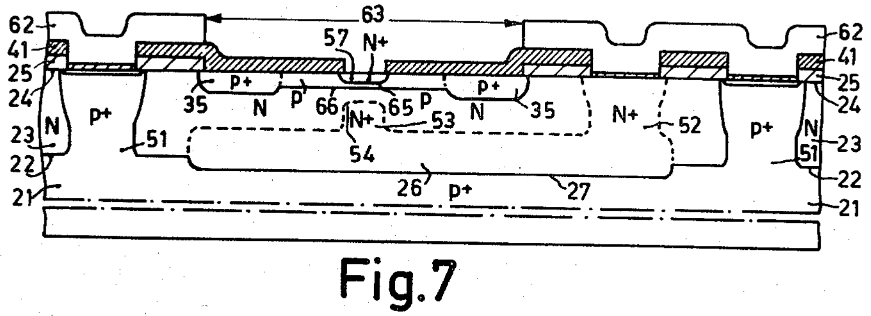
Figure 8:
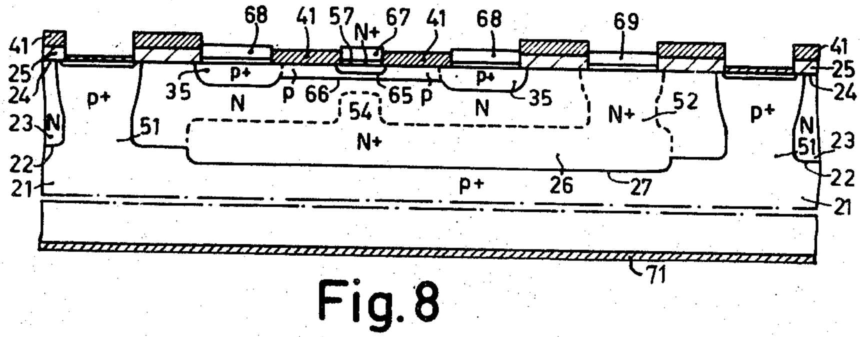

The next stage in the processing consists in the deposition of an aluminum masking layer of 1 micron thickness over the entire surface, including the residual portions of the oxide layer 41 and the phosphorus glass layers formed in the openings 43, 44 and 45 during the previous diffusion step. By a photoprocessing and etching step openings are formed in the aluminum layer, said openings corresponding approximately to the areas to be occupied by the transistor base regions. Precise location of these openings is not necessary, the main criterion being that the openings in the layer 41 where the $n^+$-regions 57 extend at the surface are free of the aluminum and the openings in the layer 25, 41 where the $n^+$-collector contact regions 52 extend at the surface are masked by the aluminum. FIG. 7 shows the aluminium layer 62 having an opening 63 therein, the opening 63 including the area of the surface at which the previously diffused $p^+$-base contact regions 35 and the p-type surface layer 60 extend. The residual phosphorus glass in the previously formed opening 45 where the $n^+$-emitter region concentration 57 has been diffused is removed by a simple light etching treatment.

The semiconductor body is then placed in the target chamber of a boron ion implantation apparatus. Implantation to define the parts of the transistor base regions to be situated directly below the previously diffused emitter region concentrations 57 is effected with boron ions at 100 kev. with a dose of $1\times10^{14}/\text{cm.}^2$. This implantation and subsequent annealing treatment results in the structure shown in FIG. 7. The location of the emitter/base junction 65 and the directly underlying part of the collector/base junction 66 are determined simultaneously by this boron ion implantation, the boron ions being implanted in the semiconductor body only over an area of the surface in the opening in the silicon oxide layer 41, said area extending above the previously diffused emitter region concentration 57. At this area the boron ions pass directly into the silicon and are implanted through said region including the diffused emitter region concentration. Implantation substantially does not occur through the boron doped oxide layer portion 41 remaining on the surface in the opening 63. The simultaneously defined emitter/base junction 65 and collector/base junction 66 extend respectively at distances of 0.3 micron and 0.5 micron from the surface in the vicinity of the emitter region 57. The collector region of the transistor comprises the remaining n-type portion of the island in the n-type epitaxial layer and the highly doped region 26, 53, 52. This configuration of the collector region provides a transistor having a very low collector/base junction capacitance and a low collector series resistance. The low collector/base junction capacitance is because the depletion layer associated with the collector/base junction 66 at positions beyond the emitter region can spread far into the n-type collector part formed in the original epitaxial layer. The provision of the portion 53 of the $n^+$-part of the collector region extending closer to the surface only below the emitter region provides for low collector series resistance.

The residual parts of the aluminum layer 62 are removed prior to said annealing step which is at 800° C. for 30 minutes.

By a further photoprocessing and etching step openings are made in the residual portions of the composite insulating layer 25, 41 to expose the $p^+$-base contact regions 35, and the $n^+$-collector contact region 52.

A metal contact layer is then deposited over the entire surface, this layer consisting of a thin titanium layer, for example of 1000 A. thickness, on the silicon surface and an aluminum layer of 0.6 micron thickness on the titanium layer. By a photoprocessing and etching step the titanium/aluminum contact layer is defined to form the contact structure shown in FIG. 8 in which the emitter region 57 is contacted by a titanium/aluminum part 67, the $p^+$-base contact regions are contacted by titanium/aluminum layer parts 68 and the $n^+$-collector region is contacted by a titanium/aluminum layer part 69. These contact parts of the titanium/aluminum layer extend further over the silicon oxide layers 25, 41 in contact with other circuit elements of the integrated circuit and together constitute an interconnection pattern with terminal portions for connection of supply conductors. On the opposite surface of the semiconductor body a metal contact layer 71 is deposited to form a low resistance contact to the $p^+$-substrate 21.

Thereafter the body is heated at 500° C. for 15 minutes in order to improve the contact between the titanium layer parts and the silicon surface.

It will be appreciated that the aluminum masking layer 63 used during the boron implantation step may not be required in some circumstances. This applies when the range of the boron ions is such that no implantation can occur through the insulating layer parts 25, 41 on the surface and when the exposed surface part at which the $n^+$-collector contact region 52 extends is sufficiently highly doped with donor impurity to prevent overdoping by the boron ions which will be implanted at this location when such an aluminum masking layer is not present.

The application of a method in accordance with the invention in the manufacture of a semiconductor integrated circuit having so-called "collector-tub" isolation will now be described with reference to FIGS. 9 to 12. The starting body is a $p^-$-silicon substrate uniformally doped with boron in a concentration of $5\times10^{14}$ atoms/cm.$^3$. A silicon oxide layer of 2000 A. thickness is grown on the substrate surface by oxidation in wet oxygen at an elevated temperature. By a photoprocessing and etching step a plurality of openings are formed in the silicon oxide layer, said plurality corresponding in number to the number of islands to be formed in an epitaxial layer to be provided on the substrate at a later stage of the manufacture. A phosphorous diffusion step is then carried out in the openings to form $n^+$-surface regions in the substrate, the surface concentration being $5\times10^{20}$ atoms/cm.$^3$. Thereafter the silicon oxide layer is removed and the substrate surface prepared for epitaxial deposition. A $p^-$-silicon layer of 3 microns thickness containing a uniform concentration of boron of $5\times10^{14}$ atoms/cm.$^3$ is then epitaxially deposited on the substrate surface. This buries the phosphorous diffused $n^+$-regions and during deposition diffusion of phosphorous form the highly doped $n^+$-regions occurs into the overlying parts of the lightly doped material of the epitaxial layer.

A layer of silicon oxide of 3000 A. thickness is then grown on the epitaxial layer surface by oxidation in wet oxygen at an elevated temperature. By a photoprocessing and etching step openings are formed in the silicon oxide layer at locations situated directly above the peripheries of the buried $n^+$-regions. A phosphorous diffusion step is then carried out in the exposed portions to form $n^+$-surface regions which are subsequently to be used in defining $n^+$-walls extending through the epitaxial layer from the surface to the $n^+$-buried regions.

By a further photoprocessing and etching step further openings are made in the oxide layer and boron is diffused into the exposed surface portions to define $p^+$-surface regions which subsequently are to form low resitance $p^+$-base contact regions.

Figure 9:
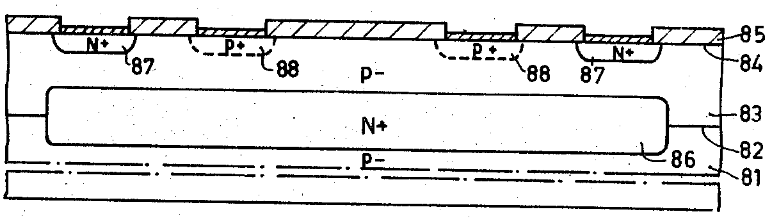

FIG. 9 shows a part of the semiconductor body after this step in the manufacture. The body comprises a $p^-$-silicon substrate 81 having a surface 82 on which a $p^-$-silicon epitaxial layer 83 of 3 microns thickness is present. On the surface 84 of the $p^-$-epitaxial layer 83 there is a silicon oxide layer 85. A buried $n^+$-region 86 extends at the substrate surface and into the overlying part of the epitaxial layer 83, the region 86 having been formed by the initial phosphorus diffusion into the substrate 81 and the subsequent diffusion of the phosphorus into the epitaxial layer 83 during deposition thereof. At the surface of the epitaxial layer an $n^+$-diffused region extends above the outer periphery of the buried $n^+$-region 86 and two $p^+$-base contact regions 88 extend above the buried $n^+$-region 86.

Thereafter openings are made in the silicon oxide layer, said openings including the surface portions occupied by the $p^+$-regions 88. A boron doped silicon oxide layer of 0.5 micron thickness is then deposited over the whole surface from a mixture of diborane ($B_2H_6$) and silane ($SiH_4$) in oxygen. After this deposition a layer of molybdenum of 1 micron thickness is deposited over the entire surface of the boron doped oxide layer 89. By a photoprocessing and etching step openings are made in the molybdenum layer and underlying silicon oxide layer parts to expose the surface portions occupied by the $n^+$-regions 87 and further surface portions situated substantially centrally disposed above the buried regions 86, the latter surface portions being where transistor emitters are to be formed. At this stage of the processing the $p^+$-base contact surface regions 88 remain covered by the boron doped silicon oxide 89 layer and overlying molybdenum masking layer 90.

The semiconductor body is then subjected to a proton bombardment step at 700° C. under exactly the same conditions of energy, dose and orientation as in the previous embodiments.

Figure 10:
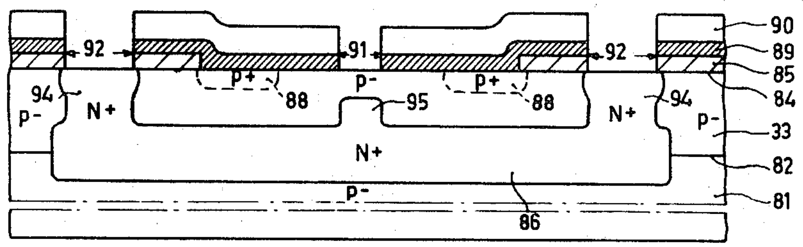

FIG. 10 shows a part of the body after this proton bombardment and heating step.

The molybdenum layer 90 acts as a mask during proton bombardment. At the location of the opening 91 protons incident on the exposed surface portion cause internal damage to the underlying crystal structure in the vicinity of the boundary between the $p^-$-material of the epitaxial layer 83 and the higher doped $n^+$-region 86. At the heating temperature of 700° C., enhanced diffusion of phosphorus occurs across this boundary from the higher doped $n^+$-region 86 into the lower doped $p^-$-region of the epitaxial layer and an $n^+$-portion 95 is formed extending from the buried region 86. The $n^+$-portion 95 is situated in precise registration with the opening 91, the p-n junction between the $n^+$-region 95 and the $p^-$-epitaxial layer extending at a distance of approximately 1 micron from the surface. At the location of the opening 92 where the $n^+$-surface region 87 (FIG. 9) is exposed, the proton bombardment causes internal damage of the crystal structure in the vicinity of the boundary between the $p^-$-material of the epitaxial layer 83 and the higher doped $n^+$-region 86. At the heating temperature of 700° C. enhanced diffusion of phosphorus occurs across this boundary from the higher doped $n^+$-region 86 into the lower doped $p^-$-region of the epitaxial layer. Further enhanced diffusion of phosphorus in the opposite direction occurs from the previously provided $n^+$-region 87 into the underlying epitaxial layer. This simultaneously effected enhanced diffusion in opposite directions results in the formation of an $n^+$-wall 94 extending between the surface of the epitaxial layer and the $n^+$-buried region 86. This wall 94 defines a $p^-$-island in the epitaxial layer. The so-called "tub" $n^+$-region constituted by the wall 94 and the buried regions 86, 95 constitutes a collector region of a transistor, the emitter and base regions subsequently being defined in the island. Isolation of the transistor is achived on reverse bias of the junction between the $n^+$-tub region and the $p^-$-substrate and epitaxial layer parts thereon. Due to the very low doping of the $p^-$-substrate 81 and layer 83 this isolation junction has a very low capacitance.

The next step in the processing is to remove the molybdenum masking layer parts 90. A heating step is then effected at 950° C. for 30 minutes to diffuse boron into parts of the silicon surface on which the boron doped oxide layer parts 89 are present. Where the layer parts 89 are situated on the thermally grown oxide layer parts 85 no boron diffusion into the silicon occurs because the underlying layer parts act as a mask. This results in a p-type surface region being formed directly below the parts of the doped oxide layer 89 in direct contact with the surface. Thereafter a phosphorus diffusion step is effected to form an emitter region concentration of phosphorus in the opening 91 remaining in the silicon oxide layer 89. Phosphorus may also be diffused into the opening 92 remaining in the silicon oxide layer 89 above the $n^+$-wall 94 but this only serves to increase the surface concentration by a small extent at this location.

An aluminum masking layer of 1 micron thickness is then deposited over the entire surface. By a further photoprocessing and etching step a plurality of openings are defined in the aluminum layer, said openings being situated above $p^-$-islands defined in the epitaxial layer by the collector "tubs" 94, 86, 95. In the part of the circuit shown in the drawing the phosphorus glass layer formed in the opening 91 in the boron doped silicon oxide layer 89 during the phosphorus emitter diffusion is removed by a simple light etching treatment.

Thereafter a boron ion implantation step is carried out using the aluminum layer as a mask. This boron implantation step is carried out to determine a part of the base region to be situated directly below the emitter region in those islands where transistors are to be formed. As in the previous embodiment, in some circumstances the aluminum masking layer may be omitted provided the $n^+$-wall portions 51 where they extend to the surface have a sufficiently high donor doping to prevent overdoping by the boron ions which will be implanted at these locations when such an aluminum masking layer is not present.

Figure 11:
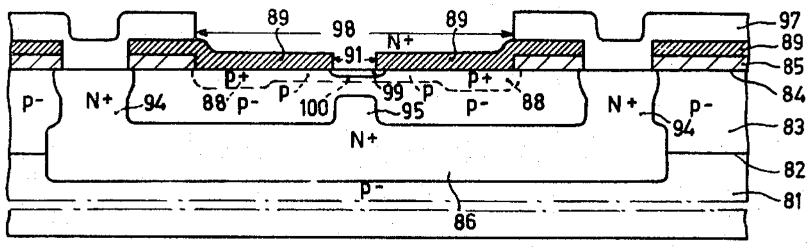

It is noted that in some islands defined in the $p^-$-epitaxial layer by $n^+$-walls 94 and buried $n^+$-regions 86, circuit elements other than transistors may be formed, for example resistors. In these islands the emitter diffusion is not carried out and the provision of the $n^+$-region 95 by bombardment induced enhanced impurity diffusion is not necessary in these islands. Implantation is carried out with boron ions at 100 kev. with a dose of $1\times10^{14}$/cm.$^2$. This implantation results in the structure shown in FIG. 11, the final location of the transistor regions and junctions as shown in the figure being determined by a subsequently effected annealing step. FIG. 11 shows the boron doped silicon oxide layer parts 89 having an aluminum masking layer 97 thereon. An opening 98 is situated in the aluminum layer 97 above the island in the epitaxial layer. The boron doped silicon oxide layer 89 covers the silicon surface in this opening with the exception of the opening 91 previously formed for proton bombardment and emitter diffusion. Implantation of boron ions is effected only into the part of the island below the opening 91 in the silicon oxide layer 89, the boron ions substantially not being implanted in the silicon through the boron doped silicon oxide layer 89 at the remainder of the opening 98. Boron ions which are implanted below the opening 91 pass through the previously diffused emitter concentration of phosphorus. This boron implantation determines the emitter/base junction 99 and a more highly doped portion 100 of the base region directly below the emitter region, which portion forms a continuation of the more highly doped p-type surface zone formed by diffusion of boron from the boron doped oxide layer 89. The remaining $p^-$-part of the island in the $p^-$-epitaxial layer also forms part of the base region, the base/collector junction being the junction between this $p^-$-part and the $n^+$-region constituted by the wall 94 and the buried region 86, 95. This transistor configuration has a low base/collector junction capacitance because the depletion layer associated with this junction can spread far into the $p^-$-part of the base region. The transistor also has a low collector series resistance due to the provision of the $n^+$-collector structures 95, 86, 94. The integrated circuit has a low isolation junction capacitance because the depletion layer associated with the isolation junction can spread far into the $p^-$-substrate and epitaxial layer.

The next stage in the processing is to remove the residual parts of the aluminum layer 97. Thereafter the semiconductor body is subjected to an annealing treatment at 800° C. for 30 minutes.

Figure 12:
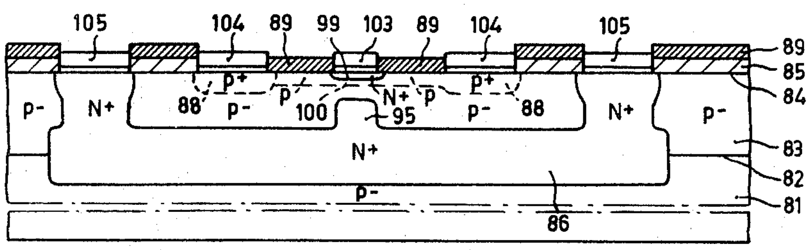

By a further photoprocessing and etching step openings are made in the composite insulating layer 85, 89 to expose the $p^+$-base contact portions 88. Metal contact layers of titanium/aluminum are then provided as in the previous embodiment and defined by a photoprocessing and etching step to yield the structure as shown in FIG. 12. The $n^+$-emitter region is contacted by a titanium/aluminum part 103, the $p^+$-base contact regions are contacted by a titanium/aluminum part 104, and the $n^+$-wall 94 of the collector is contacted by a titanium/aluminum part 105.

Thereafter the body is heated at 500° C. for 15 minutes in order to improve the contact between the silicon surface and the titanium layer parts.

Many variations may be made to the preceding embodiments without departing from the scope of the invention. For example, the transistor emitter and base regions in the integrated circuit may be formed by conventional diffusion techniques subsequent to the proton bombardment. Alternatively when ion implantation is used to introduce the base impurity, this implantation may be effected before introduction of the emitter impurity concentration. The proton bombardment to profile the highly doped collector region parts may be carried out so that this profiling is effected at only some of the transistor locations in the circuit. In modifications of the third embodiment the p-type boron base implantation may be omitted in some cases. In other cases the diffusion of boron from a boron doped glass layer may be dispensed with.

The method may be employed in the manufacture of other semiconductor devices, particularly in the manufacture of devices in which diffusion of impurity across a boundary from a higher doped region into an overlying lower doped region is required in a direction towards a surface of the semiconductor body at which processing steps are effected, for example in the manufacture of a varicap diode.

What I claim is:

1. A method of manufacturing a semiconductor device wherein a semiconductor body comprising a boundary between a higher doped region and a lower doped region is subjected to bombardment with accelerated particles or ions which are directed towards the boundary from the side thereof at which the lower doped region is present, the bombardment being effected to cause internal damage of the crystal structure in the vicinity of the bondary, and the semiconductor body being maintained at an elevated temperature during said bombardment to produce an enhanced diffusion of impurity across the boundary from the higher doped region into the lower doped region.

2. A method as claimed in claim 1, wherein the bombardment is effected with protons.

3. A method as claimed in claim 1, wherein the bombardment is effected with neutrons.

4. A method as claimed in claim 1, wherein the bombardment is effected with impurity ions which are implanted in the semiconductor body and in addition to causing internal damage of the crystal structure also serve to determine one of the conductivity and conductivity type of a region of the body.

5. A method as claimed in claim 1 wherein the incidence of the bombarding particles or ions on the semiconductor body is such as to produce channelling of the crystal lattice by said particles or ions.

6. A method as claimed in claim 1, wherein the higher doped region and the lower doped region are of the same conductivity type.

7. A method as claimed in claim 1, wherein the higher doped region and the lower doped region are of different conductivity types.

8. A method as claimed in claim 1, wherein the boundary substantially coincides with the interface between a subsetrate region of the body and an epitaxial layer thereon.

9. A method as claimed in claim 8, wherein the higher doper region lies mainly in the substrate region and the lower doped region lies in the epitaxial layer.

10. A method as claimed in claim 1, wherein the incidence of the particles or ions on the semiconductor body at the side of the boundary at which the lower doped region is present is localised so that the bombardment induced enhanced impurity diffusion from the higher doped region into the lower doped region is produced across only a part of the area of the boundary.

11. A method as claimed in claim 10, wherein the bombardment is effected in the presence of a mask at the semiconductor body surface, the bombardment induced enhanced impurity diffusion being produced across part of the area of the boundary determined by an opening in the mask.

12. A method as claimed in claim 1, wherein the bombardment is effected to produce, simultaneously with the enhanced impurity diffusion from the higher doped region into the lower doped region, enhanced diffusion of impurity in the opposite direction from another higher doped region into a lower doped region.

13. A method as claimed in claim 12, wherein the two initially higher doped regions are of the same, one conductivity type and spaced by a common lower doped region, the simultaneously produced bombardment induced enhanced diffusions in opposite directions being effected to yield a continuous region of said one conductivity type between said initially higher doped regions.

14. A method as claimed in claim 1, for the manufacture of a planar bipolar transistor, wherein the bombardment induced enhanced impurity diffusion is effected to determine the extent and doping of a part of the collector region.

15. A method as claimed in claim 14, wherein the bombardment induced enhanced impurity diffusion is effected to determine the extent and doping of a part of the collector region situated directly below the emitter region.

16. A method as claimed in claim 15, wherein a transistor is formed which comprises a collector region having a highly doped part which is situated underlying the collector/base junction, said highly doped part comprising a first portion extending below a first area of the collector/base junction which lies directly below the emitter region and an adjoining, second portion situated below an adjoining, second area of the collector/base junction, said first portion being situated closer to the common surface at which the transistor junction terminate than the adjoining, second portion, the extent of said first portion being determined by the said bombardment induced enhanced impurity diffusion produced by bombardment of an area of the common surface corresponding substantially in size and position to the area of said surface occupied by the emitter region.

17. A method as claimed in claim 16, wherein the bombardment is effected at an area of the common surface exposed by an opening in a masking layer on the common surface, said opening being subsequently used for introduction of the emitter impurity concentration into the body.

18. A method as claimed in claim 16, wherein the higher doped region and the lower doped region between which bombardment induced enhanced impurity diffusion is effected are both of the same, one conductivity type as the collector region, the higher doped region being present at a surface portion of a substrate region of the one conductivity type and the lower doped region being present in an epitaxial layer of the one conductivity type on the substrate region, said second portion of the highly doped part of the collector region being formed by the bombardment induced enhanced impurity diffusion in the epitaxial layer.

19. A method as claimed in claim 1, for the manufacture of a semiconductor integrated circuit, wherein the bombardment induced enhanced impurity diffusion is effected to at least partly define a wall surrounding an island in an epitaxial layer, said wall and epitaxial layer being of different conductivity types.

20. A method as claimed in claim 19, wherein the semiconductor body comprises an epitaxial layer of one conductivity type on a substrate region of the opposite conductivity type, the substrate region having a higher doping than the epitaxial layer at the boundary therebetween, enhanced diffusion of impurity characteristics of the opposite conductivity type across a portion of said boundary from the substrate region into the epitaxial layer being effected by the bombardment of a portion of the epitaxial layer surface, said bombardment induced enhanced impurity diffusion at least partly defining a wall of the opposite conductivity type extending from the substrate region to the surface of the epitaxial layer, said wall surrounding an island of the one conductivity type in the epitaxial layer.

21. A method as claimed in claim 20, wherein prior to the bombardment, at said portion of the epitaxial layer surface a region of the opposite conductivity type is formed extending in, but not through, the epitaxial layer, the enhanced impurity diffusion effected on bombardment forming a continuous wall of the opposite conductivity type between said region of the opposite conductivity type and the substrate region.

22. A method as claimed in claim 19, wherein simultaneous with the definition of the boundary wall by the bombardment induced enhanced impurity diffusions, the extent and doping of a part of the collector region of a transistor to be formed in an island in the epitaxial layer is also determined by bombardment induced enhanced impurity diffusion characteristic of the one conductivity type into the island from a highly doped buried layer of the one conductivity type at the interface between the substrate region and the epitaxial layer.

23. A method as claimed in claim 22, wherein a part of the collector region located directly below the emitter region is determined by bombardment induced enhanced impurity diffusion.

24. A method as claimed in claim 22, wherein a part of the collector region extending between the buried layer and the surface of the epitaxial layer and forming a low resistance path from the surface to the buried layer is determined by bombardment induced enhanced impurity diffusion.

25. A method as claimed in claim 19, wherein the semiconductor body comprises a buried region of one conductivity type situated between a substrate region of the opposite conductivity type and an epitaxial layer of the opposite conductivity type, said epitaxial layer having a lower doping than the buried region at the boundary therebetween, enhanced impurity diffusion being effected across a portion of said boundary from the buried region into the epitaxial layer by the bombardment of a portion of the epitaxial layer surface, said bombardment induced enhanced impurity diffusion at least partly defining a wall of the one conductivity type extending from the buried region to the surface of the epitaxial layer, said wall surrounding an island of the opposite conductivity type in the epitaxial layer.

26. A method as claimed in claim 25, wherein prior to the bombardment, at said portion of the epitaxial layer surface a region of the one conductivity type is formed extending in, but not through, the epitaxial layer, the bombardment induced enhanced impurity diffusion forming a continuous wall of the one conductivity type between said region of the one conductivity type and the buried region of the one conductivity type.

27. A method as claimed in claim 25, wherein simultaneous with the definition of the wall by the bombardment induced enhanced impurity diffusion, the extent and doping of a part of the collector region of a transistor is also determined by bombardment induced enhanced impurity diffusion characteristic of the one conductivity type into the island from the buried region, the buried region and wall of the one conductivity type forming part of the collector region and the emitter region and base region being formed in the island surrounded thereby, said part of the collector region lying directly below the emitter region.

28. A method as claimed in claim 19, wherein the bombardment induced enhanced impurity diffusion is effected at a plurality of locations in the semiconductor body to at least partly define a plurality of walls in the epitaxial layer.

29. A method as claimed in claim 19, wherein the bombardment induced enhanced impurity diffusion is effected at a plurality of locations in the semiconductor body to define a plurality of transistor collector region parts, the transistors being formed in or associated with one or more islands in the epitaxial layer.

30. A semiconductor device made in accordance with the method of claim 10.

References Cited

UNITED STATES PATENTS

| | | | |
|---|---|---|---|
| 3,445,734 | 4/1969 | Pecoraro et al. | 29—571 |
| 3,449,643 | 6/1969 | Imaizumi | 317—235 |
| 3,533,857 | 10/1970 | Mayer et al. | 148—1.5 |
| 3,589,949 | 6/1971 | Nelson | 148—1.5 |
| 3,663,308 | 5/1972 | Davey | 148—1.5 |

L. DEWAYNE RUTLEDGE, Primary Examiner

J. M. DAVIS, Assistant Examiner

U.S. Cl. X.R.

317—235; 148—191